US006888741B2

(12) United States Patent
Wong

(10) Patent No.: US 6,888,741 B2
(45) Date of Patent: May 3, 2005

(54) SECURE AND STATIC 4T SRAM CELLS IN EDRAM TECHNOLOGY

(75) Inventor: Robert C. Wong, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 137 days.

(21) Appl. No.: 10/223,198

(22) Filed: Aug. 16, 2002

(65) Prior Publication Data

US 2004/0032761 A1 Feb. 19, 2004

(51) Int. Cl.[7] .............................................. G11C 11/00
(52) U.S. Cl. ....................... 365/154; 365/156; 365/149; 257/298
(58) Field of Search ................................. 365/154, 156, 365/149, 298; 257/298

(56) References Cited

U.S. PATENT DOCUMENTS

| | | | | |
|---|---|---|---|---|
| 5,145,799 A | * | 9/1992 | Rodder .......................... | 437/47 |
| 5,434,811 A | * | 7/1995 | Evans, Jr. et al. ........... | 365/145 |
| 5,572,460 A | * | 11/1996 | Lien ............................. | 365/154 |
| 5,751,627 A | * | 5/1998 | Ooishi .......................... | 365/145 |
| 5,844,836 A | * | 12/1998 | Kepler et al. ................ | 365/156 |
| 6,038,163 A | * | 3/2000 | Clemens et al. ............. | 365/154 |
| 6,707,702 B1 | * | 3/2001 | Komatsuzaki ............... | 365/145 |

OTHER PUBLICATIONS

Kenji Noda, et al., "An Ultrahigh–Density High–Speed Loadless Four–Transistor SRAM Macro with Twisted Bit–line Architecture and Triple–Well Shield", IEEE Journal of Solid–State Circuits, vol. 36, No. 3, Mar. 2001, pp 510–515.

* cited by examiner

Primary Examiner—Connie C. Yoha
(74) Attorney, Agent, or Firm—Whitham, Curtis & Christofferson, P.C.; Ira D. Blecker

(57) ABSTRACT

Disclosed herein is a 4T (four transistor) SRAM cells. Stability, fabrication and integration density advantages as well as a high degree of soft error immunity with small and potentially tailorable write delay penalty may potentially be available in a memory cell by providing a source of pull down current through leakage of stabilizing capacitors, pass gate transistor leakage/off current, or a combination thereof. The source of pull down current allows omission of active pull down devices in a four transistor memory cell circuit to substantially reduce memory cell size or footprint while providing levels of soft error immunity comparable to or exceeding that of known 6T memory cell designs fabricated at comparable minimum feature size regimes and avoiding the expected increase of soft error rates as minimum feature size and/or number of circuit elements is reduced.

20 Claims, 4 Drawing Sheets

SECURE AND STATIC 4T SRAM CELLS IN EDRAM TECHNOLOGY

BACKGROUND OF THE INVENTION

1. Field of the Invention

The present invention generally relates to digital memory cell circuits for high density integrated circuits and, more particularly, to memory circuits having reduced size with improved soft error immunity.

2. Description of the Prior Art

Modern digital data processors are often limited in program execution speed by the time required for memory access. However, memory access time and the cost of storage varies widely with the storage medium. Therefore, various arrangements have come into widespread use which seek to provide a limited amount of memory in electronic storage, such as static or dynamic random access memories (RAM), which may be accessed very rapidly while larger storage is provided in, for example, magnetic media. Nevertheless, the demand for increased processing speed with reductions in the cost of electronic memory with increased integration density of integrated circuits has led to increased demands for more storage capacity of integrated circuit memories and memory circuits which can be integrated with digital data processing circuits.

In general, static RAM (SRAM) devices provide more rapid access than dynamic RAM (DRAM) since the former are comprised of bistable circuits which have much reduced refresh requirements, if any, and provide reduced response time by sense amplifiers when data is read since an active device rather than a capacitor (which may be partially discharged) provides the signal which is read. Writing speed of SRAMs is also generally faster than DRAMs since there is generally less capacitance on which charge must be developed. However, SRAM memory cells have more elements and thus must generally be larger than DRAM cells even though a capacitor, which is the storage element in DRAM cells, is not necessarily required in SRAM cells.

However, it has been found that the degree to which any given memory cell design can be scaled to smaller sizes without compromising performance is often limited. Additionally, transistor characteristics may be significantly degraded as transistor size and channel length, in particular, is reduced; reducing off resistance and increasing leakage. Similarly, in dynamic memories in which data is stored as charge on a capacitor, operating margins are often severely reduced and refresh rates increased as capacitor size and capacitance are reduced and array size and word and bit line length and capacitance is increased. Perhaps more importantly at the current state of the art, memory cells become increasingly susceptible to soft errors due to ionization and charge injection caused by alpha particles impinging on the chip at or close to the memory cell. It is generally considered that the soft error rate doubles with each new generation of memory device designs. SRAM cells are particularly susceptible to soft errors since charge injection can cause the bistable circuit of the memory cell to switch or flip storage states.

The degree to which a SRAM cell can be physically reduced in size (regardless of any attendant compromise of stability or imposition of operational constraint) is principally limited by the number of transistors required and, to a lesser extent, by the density of connections which must be made in metal layers (particularly the first layer which minimizes connection length and capacitance) formed over the transistors on the chip. Accordingly, SRAM memory cell circuits using fewer transistors have been of interest. In general, SRAM circuits have a minimum of six transistors and are thus referred to as 6T cells: two transistors in each of two cross-coupled inverters to form the bistable element and two additional transistors, sometimes referred to as pass gate transistors, which connect the bistable circuit to bit lines. Several attempts to design a four transistor (4T) SRAM cell have been attempted but have been less than fully successful to date.

In one known approach to a 4T cell design, the pull-up transistors of the bistable circuit are removed from the 6T circuit and specially formed PFET pass gate transistors are used to obtain an increased off-current (as compared to NFETs which are normally used—NFETs normally have greater off-current than PFETS but PFETs can be fabricated to have increased off-currents greater than NFETs, as is done in this particular case) when the bit lines are biased to $V_{DD}$ during standby periods and thus can serve as the pull-up current source. The reduced size made possible by this design is principally due to the reduction of the number of transistors and the use of a so-called direct strap allowing polysilicon and active silicon structures to be shorted together by one contact. However this size reduction and increased integration density is achieved only at the expense of several serious trade-offs.

First, this design is much more susceptible to soft errors than the corresponding 6T design; the resistance of which to soft errors at current minimum feature size regimes such as 0.13 micron and 0.09 micron minimum feature size ground rules is considered marginal although acceptable in some short term and non-critical storage applications such as for display screen memories.

Second, two additional process steps must be employed for the "direct strap" structure and to produce "very leaky" PFET pass gate transistors in order to fully exploit the reduced size possible through reduction of the number of interconnections and transistors.

Third, the requirement for applying $V_{DD}$ to the bit lines during standby periods to provide pull-up essentially precludes constant or consecutive access since the half-selected cells will be disturbed. Half-selected cells refers to the cells along the selected rows and unselected columns or unselected rows and selected columns. Cells along the selected columns and unselected rows will be losing data since the static pull-up leakage current would be missing when the selected bit lines are switched toward ground. Cells along the selected rows and unselected columns will be losing data since the low nodes are pulled up by the pass gate. Since the PFET is made "very leaky" with a special implant process, it will be more conductive than the pulldown NFET and can easily flip the cell. Accordingly, these constraints have prevented this design approach from being applied to memory cells for general applications.

It would be desirable to provide a memory cell which has one or more advantages, such as any of the following: reduced chip area having enhanced immunity to soft errors, which can be formed by processes of reduced complexity and which are free from constraints on continuous or consecutive access.

SUMMARY OF THE INVENTION

According to the present invention, a memory cell and integrated circuit including a memory cell is provided comprising a pair of cross-coupled pull-up transistors, a pair of pass gate transistors, and a source of pull down current to ground. The source of pull down current may be provided by capacitor leakage, or transistor leakage but preferably by a combination of the two.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
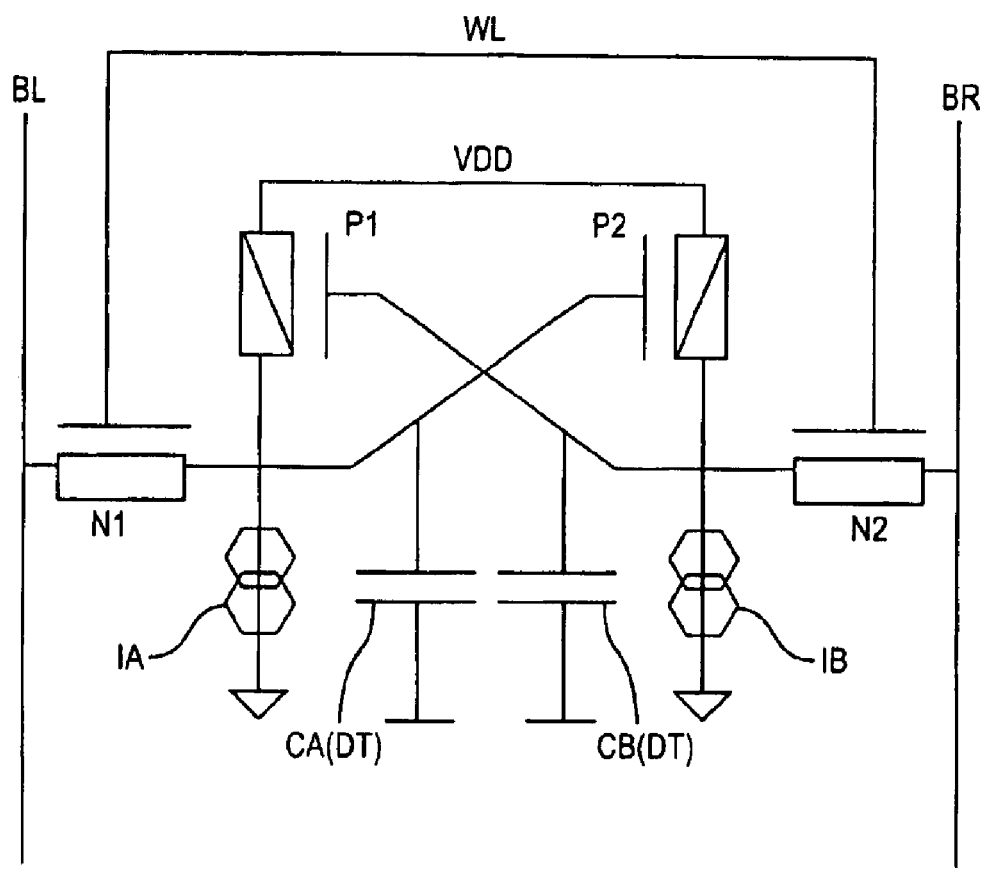
FIGS. 1A and 1B are a schematic circuit diagram of the 4T cell in accordance with a preferred embodiment of the invention, and a plan view of a preferred cell layout of the circuit of FIG. 1A, as formed on a semiconductor chip, respectively.

Referring now to the drawings, and more particularly to FIG. 1A, there is shown a schematic circuit diagram of a 4T memory cell in accordance with the invention. It will be appreciated by those skilled in the art from the following discussion that the present invention exploits several generally undesirable characteristics of various circuit elements which are increased as the elements are scaled to smaller sizes to provide a memory cell having fewer elements which nevertheless achieves enhanced stability without constraints on the mode of operation which conflict with or may be contrary to common modes of operation. These meritorious effects are achieved in accordance with the invention while improving soft error immunity or at least avoiding expected increases in soft error susceptibility.

More specifically, the invention principally uses a capacitor technology developed for so-called embedded DRAMs (EDRAM) which can be fabricated at extremely small size in a substrate below other active elements such that there is no area penalty to stabilize the SRAM circuit against soft errors while limiting the performance penalty to an acceptable level. U.S. Pat. Nos. 5,831,301, 5,945,707, 6,074,909 and 6,184,107 disclose EDRAM technology in detail and are incorporated by reference in their entirety for that purpose. However, other types of capacitors which can be made to have similar values and characteristics can be used in the practice of the invention even though EDRAM technology capacitors is much preferred.

The capacitor values are small and leakage is, in one sense, unimportant to the storage function of the memory cell since charge is maintained through active devices but, on the other hand, capacitor leakage exhibited by EDRAM capacitors is significant to the operation of the memory cell circuit of the invention and supports the reduced number of transistors by essentially performing the function of pull-down transistors which can thus be eliminated. Further, the capacitor leakage limits adverse effects of the reduced off-resistance characteristic of short channels as transistors are scaled to extremely small sizes while allowing avoidance of operational constraints required by other known approaches to 4T cell design such as that described above. The values of transistor and capacitor leakage are also fortuitously exploited to reduce cell size which leads to faster access.

The 4T memory cell circuit of FIG. 1A differs from the conventional 6T memory cell design by the omission of pull-down transistors and the inclusion of two capacitors CA, CB connected to the bases/storage nodes of the cross-coupled pull-up transistors which are also the feedback connections which engender bistability of the circuit. The leakage of the capacitors CA, CB to ground and leakage of N1, N2 to bit lines is depicted as current sources IA, TB at the locations where pull-down transistors would be located in a 6T cell design. This design contrasts with the above-described approach to a 4T cell design in that it is the pull-down transistors rather than the pull-up transistors which are omitted; allowing the use of capacitors CA, CB for stabilization and NFETs N1, N2 for pass gate transistors and the avoidance of operational constraints since the increased leakage of PFET pass gate transistors and $V_{DD}$ bit line bias during standby operation is not needed for pull-up since PFET pull-up transistors P1, P2 remain from the 6T design. This circuit design is also amenable to several other refinements of implementation which will be described below.

The addition of capacitors to an SRAM cell for the sole purpose of increasing stabilization against soft errors is known in the art. However, in such a case, such stabilization is achieved at the expense of reduced speed of writing operations, an increase in complexity and size of the cell, and the processes required to produce it. It should be appreciated that the use of capacitors in accordance with the present invention and in combination with the circuit of FIG. 1A provides numerous additional benefits beyond those expected from simple addition of capacitors to a known circuit.

Specifically, the addition of capacitors of small value to the 4T circuit in accordance with the invention substantially eliminates susceptibility to soft errors while having only a very limited adverse effect on write cycle duration and avoiding the expected increase in soft error susceptibility due to the reduction in the number and scaling to small sizes of active elements in the memory cell by exploiting leakage of the capacitors and transistors. That is, the immunity to soft errors is substantially the same as adding capacitors of the same characteristics and value to a comparable 6T design. This effect is enhanced by the use of NFET pass gate transistors (which exhibit a higher off-current than PFET transistors which are not specially processed to deliberately increase off current). Therefore, the fabrication process for arrays of memory cells in accordance with the invention is simplified and generally conformed to processes for fabrication of known designs. No special processes such as for formation of high off current devices or specially formed connections (as in the above-described prior approach to 4T memory cell design) is necessary.

By the same token, performance and soft error immunity are enhanced by the use of normal NFETs (exhibiting higher off currents than normal PFETs) as pass gate transistors and providing increased pull-down leakage current, allowing capacitors of somewhat smaller value to be employed for stability while minimizing impact of stability enhancement on write cycle duration and enhancing stability of the cell against soft errors relative to known 6T cell circuit designs. In other words, the NFET off currents to ground (in accordance with normal operation of a memory cell in the standby state) will substantially guarantee that the low node stays down following a disturbance even without the capacitors C1, C2; and supplements the combined action/effect of the capacitor leakage to ground and the stored charge when such capacitors are present.

In terms of soft error immunity, as is well-understood in the art, the occurrence of a soft error is a function of both the amount of charge injected, $Q_{crit}$, and the decay rate of that charge or decay period (tau, in picoseconds) to reduce the charge by a given amount or proportion (e.g. the decay constant of the current surge caused by an alpha particle). It is thus customary to estimate the amount of charge injection necessary to cause a memory cell to change or flip states based on the decay time or the rate at which the charge may be dissipated. Alternatively, it can be considered that if a given $Q_{crit}$ is injected, tau represents the time that the cell would flip states unless the amount of charge had decayed within that period. Based on simulations, the charge analysis for $Q_{crit}$ (in fC) is tabulated below for 4T and 6T cells, with and without capacitors C1 and C2, and assuming a series resistance from the cell node to the DT capacitor through the N+ diffusion, the strap and the vertical N+ polysilicon in the capacitor trench when silicide is applied in the base logic process which is less than or equal to 15K Ohms:

| tau | without C1, C2 | | with C1, C2 | |
| --- | --- | --- | --- | --- |
| (ps) | 4T | 6T | 4T | 6T |
| High node to Ground - | | | | |
| 1 | 4.4 | 6.6 | 292 | 520 |
| 5 | 12.1 | 22.5 | 1063 | 1883 |
| 10 | 7.0 | 18.7 | 1997 | 3576 |
| 30 | 5.9 | 7.0 | 5070 | 7816 |
| 100 | 8.0 | 9.2 | 3505 | 907 |
| Low node to $V_{DD}$ - | | | | |
| 1 | 0.8 | 6.4 | 95 | 126 |
| 5 | 0.8 | 8.1 | 349 | 461 |
| 10 | 0.8 | 7.7 | 632 | 616 |
| 30 | 0.8 | 10.6 | 1297 | 1193 |
| 100 | 0.7 | 22.1 | 261 | 77 |

Thus it can be seen that while the 4T design without capacitors is inferior to the 6T design without capacitors, the 4T design with capacitors is substantially superior to the 6T design without capacitors and, for some higher values of tau, is substantially superior to the 6T design with capacitors.

Figure 1B:
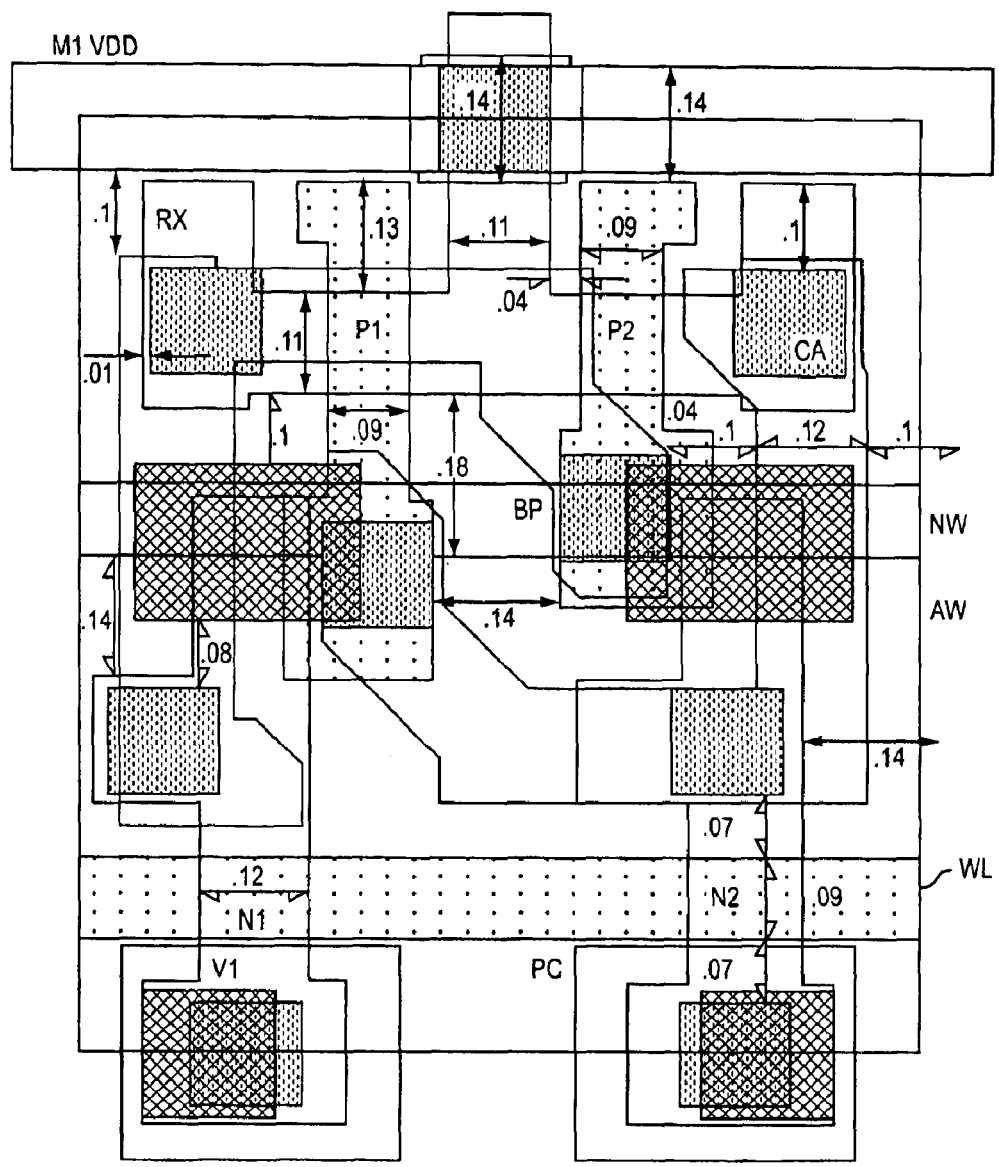

Referring now to FIG. 1B, a plan view of a preferred layout of the 4T memory cell in accordance with the invention is shown. It will be appreciated by those skilled in the art that the preferred layout of the memory cell in accordance with the invention substantially follows the schematic circuit diagram of FIG. 1A. That is, the power connection shown at the top of FIG. 1B is connected to a common connection to PFETs P1 and P2, the capacitors C1, C2, here collectively identified by the reference characters DT, are connected to the gates thereof by a connection that extends to the source/drain of the other of transistors P1, P2, word line WL extends across the cell and forms or connects to the gates of pass gate transistors N1, N2 having bit line connections at the bottom of FIG. 1B. The bit lines preferably run vertically (with reference to FIG. 1B) at the M2 metallization level. One vertical M2 channel is available per cell for external application specific integrated circuit (ASIC) connection.

This configuration also allows a simplified boundary of the N-well for formation of the PFETs and connection of the capacitors (by shorting to the N+buried capacitor plate BP). The array well AW depicted (sometime referred to as a triple well which isolates the NFET P-well from the substrate by the oppositely oriented diode formed of alternating impurity type) is optional. With the array well, the NFETs will be triple well devices and without the array well, the NFETs will remain base logic dual well devices, and the N-well NW will be used to connect the N+ buried plate BP of the capacitors.

It is currently preferred for implementation of the invention in accordance with the layout of FIG. 1B (or FIG. 3) to make the channel length of the transistors equal to the ground rule (0.09 μm) which is somewhat longer than the that of transistors made for current 6T SRAM cells. This slightly increased length serves to reduce off current which may otherwise be excessive relative to the needed degree of stability of the memory cells. Dimensions of the capacitors DT are preferably 0.17 μm×0.24 μm, similar to current EDRAM dimensions and yielding a capacitance value of about 35 fF. Ground rule waivers are also similar to current SRAM cells of 1.21 $\mu m^2$, with ground rules of 0.09 μm features.

Figure 3:
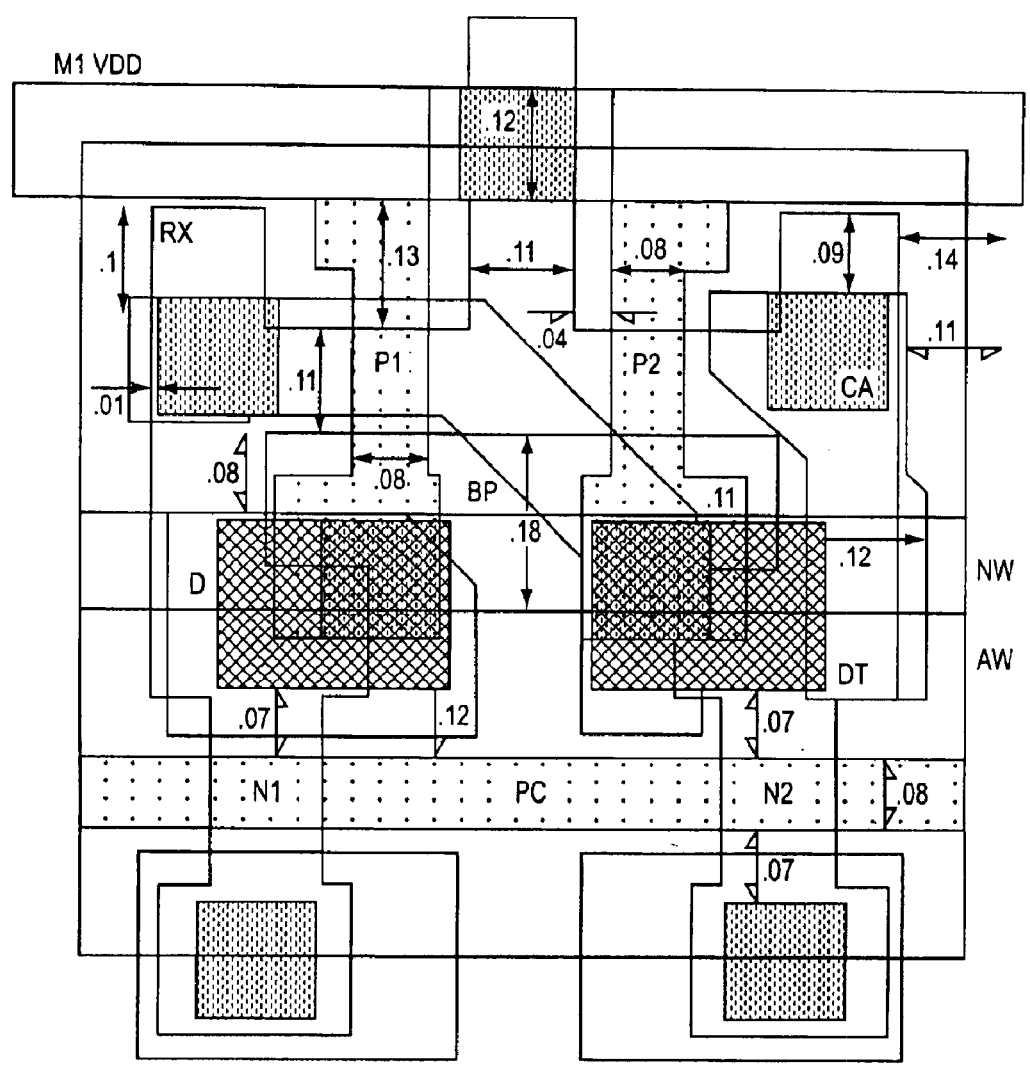
FIG. 3 is a plan view of the preferred cell layout in accordance with a preferred embodiment of the invention, when implemented on a silicon-on-insulator substrate.

The density gain of this layout as compared with an optimal layout of a 6T memory cell design is about 26% under the 0.09 μm minimum feature size ground rules. The area of the 4T cell of FIG. 1B is 0.96 $\mu m^2$. This layout is mainly constrained by spacing of N+ diffusions to P+ diffusions. If silicon-on-insulator (SOI) technology is employed in a layout as illustrated in FIG. 3, the area can be reduced to 0.76 $\mu m^2$. In either case, the density gain is made possible by connecting the P+ diffusion to the N+ diffusion through RX runner so that M1 layer congestion can be reduced without additional or specialized processes. In this case, standard silicide is preferably applied to connect the P+ and N+ diffusions on the top surface.

Figure 2:
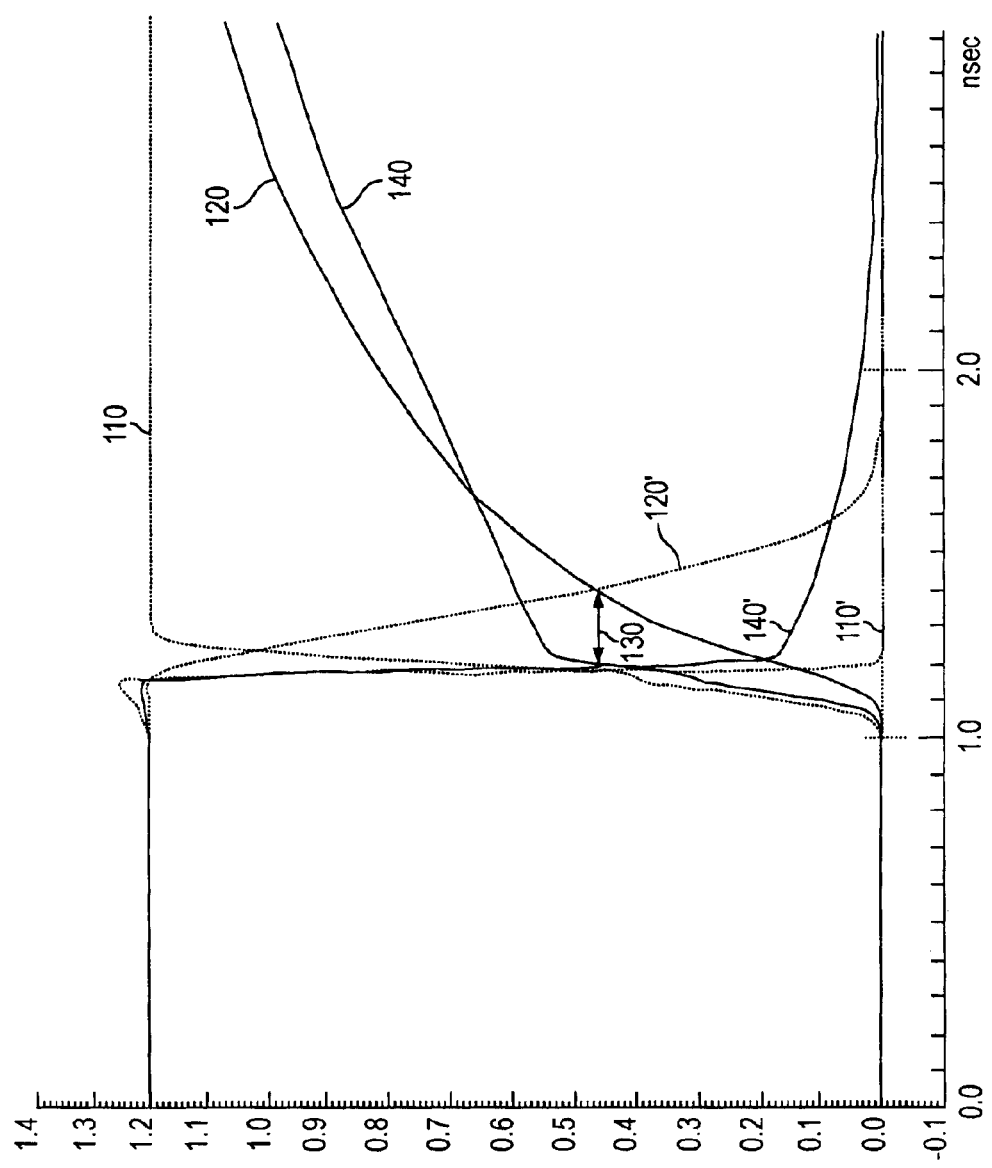
FIG. 2 is a graphical depiction of waveforms during switching of the circuit of FIGS. 1A and 1B, with and without capacitors, as determined by simulation.

Referring now to FIG. 2, the write delay due to addition of capacitors C1 and C2 is graphically depicted. The horizontal scale of FIG. 2 is in nanoseconds. Curves 110 and 110' depict the switching response in the case where capacitors C1 and C2 are omitted. Curves 120 and 120' depict the response of the circuit of FIG. 1A with capacitors C1 and C2 each having a value of 35 fF and assuming a series resistance of R=15KΩ, as was assumed for values in the above charge analysis table. It can be seen that the difference in time to the point where the nodes are of the same voltage is approximately 0.2 nsec. and thus the write delay penalty to achieve soft error suppression is very small. It is significant to note from the above tables that the degree of soft error suppression achieved with such a small write delay penalty is far greater than that of the 6T design without capacitors where the write time would be comparable to curves 110, 110'. For comparison, a simulation of the switching characteristics for the theoretical case where R=0Ω is shown by curves 140, 140' which require less time to reach the switching point (where the storage node voltages are equal) but are actually slower to reach the steady state logic voltages. Thus, it is seen that by exploiting otherwise undesirable characteristics of circuit elements as they are scaled to smaller sizes, performance can be improved over the case of merely adding capacitor stabilization to an SRAM cell, even when a connection structure is idealized.

Referring now to FIG. 3, a preferred layout for the memory cell in accordance with the invention using an SOI substrate is shown. As alluded to above, use of SOI allows a substantial further reduction in cell size or footprint over that of FIG. 1B where the memory cell is formed in a silicon substrate. This layout also largely follows the schematic circuit diagram of FIG. 1A and elements are identified by the same reference characters as were used in FIG. 1B. Therefore, further discussion of the layout is considered to be unnecessary and redundant over the discussion provided above. However, a difference of the layout of FIG. 3 which should be noted is that the bit lines preferably run vertically on the M3 metallization layer and there is one cell cross-coupling connection on horizontal metallization layer M2.

As alluded to above, since there are no active pull-down devices in the memory cell circuit of FIG. 1A, several design features are desirable but should be understood as perfecting features of the invention rather than requirements of the invention in accordance with its basic principles. First, the bit lines are preferably biased to ground during standby periods of operation. In such case, the NFETs have larger off currents than the PFETs of the memory cell. The NFET off currents to ground will guarantee that the cell low node remains at a low logic voltage even apart from the DT capacitor leakage to ground, which has the same effect. Therefore, if the preferred mode of operation by biasing the bit lines to ground during standby periods is employed, there is a wide design window for values of C1 and C2, allowing the write delay to be adjusted at will within a wide margin of soft error protection. Second, full word line access is also preferred. If all bit line columns are accessed at the same time, then the bit circuits will provide the "write back" to make sure that the cell nodes are fully restored before the next access. Otherwise, the cell nodes may have been "pinched" or pulled toward the same value during a read operation and will not be restored as rapidly.

While the invention has been described in terms of certain preferred embodiments, those skilled in the art will recognize that the invention can be practiced with modification within the spirit and scope of the appended claims.

What is claimed is:

1. A memory cell comprising
   a pair of cross-coupled pull-up transistors,
   a pair of pass gate transistors, and
   a pair of sources of pull down current to ground, said sources of pull down current exhibiting substantially equal capacitance.

2. A memory cell as recited in claim 1, further comprising capacitors respectively connected to control electrodes of said pair of cross-coupled pull-up transistors.

3. A memory cell as recited in claim 2, wherein said capacitors are EDRAM capacitors.

4. A memory cell as recited in claim 2, wherein said capacitors form a source for a portion of said pull down current.

5. A memory cell as recited in claim 1 wherein said pass gate transistors provide a current source for a portion of said pull down current.

6. A memory cell as recited in claim 1 wherein said pair of pass gate transistors are NFET transistors.

7. A memory cell as recited in claim 6, further including bit lines which are held at ground during standby periods whereby said NFET transistors provide a source of a portion of said pull down current.

8. A memory cell as recited in claim 4 wherein said pair of pass gate transistors are NFET transistors.

9. A memory cell as recited in claim 8, further including bit lines which are held at ground during standby periods whereby said NFET transistors provide a source of a portion of said pull down current.

10. A memory cell as recited in claim 1, wherein said pull-up and pass gate transistors are formed using a silicon on insulator substrate.

11. An integrated circuit comprising
    a pair of cross-coupled pull-up transistors,
    a pair of pass gate transistors, and
    a pair of sources of pull down current to ground, said sources of pull down current exhibiting substantially equal capacitance.

12. An integrated circuit as recited in claim 11, further comprising capacitors respectively connected to control electrodes of said pair of cross-coupled pull-up transistors.

13. An integrated circuit as recited in claim 12, wherein said capacitors are EDRAM capacitors.

14. An integrated circuit as recited in claim 12, wherein said capacitors form a source for a portion of said pull down current.

15. An integrated circuit as recited in claim 11 wherein said pass gate transistors provide a current source for a portion of said pull down current.

16. An integrated circuit as recited in claim 11 wherein said pair of pass gate transistors are NFET transistors.

17. An integrated circuit as recited in claim 16, further including bit lines which are held at ground during standby periods whereby said NFET transistors provide a source of a portion of said pull down current.

18. An integrated circuit as recited in claim 14 wherein said pair of pass gate transistors are NFET transistors.

19. An integrated circuit as recited in claim 18, further including bit lines which are held at ground during standby periods whereby said NFET transistors provide a source of a portion of said pull down current.

20. An integrated circuit as recited in claim 11, wherein said pull-up and pass gate transistors are formed using a silicon on insulator substrate.

* * * * *